United States Patent [19]
Popovic et al.

[11] Patent Number: 5,130,776
[45] Date of Patent: Jul. 14, 1992

[54] ULTRAVIOLET-LIGHT PHOTODIODE

[75] Inventors: Radivoje Popovic, Zug; Zeno Stössel, Baar, both of Switzerland

[73] Assignee: Landis & Gyr Betriebs AG, Zug, Switzerland

[21] Appl. No.: 483,583

[22] Filed: Feb. 22, 1990

[30] Foreign Application Priority Data

Mar. 16, 1989 [CH] Switzerland .................. 981/89-9

[51] Int. Cl.$^5$ .................. H01L 27/14; H01L 31/00; H01L 27/04
[52] U.S. Cl. .................. 357/30; 357/32; 357/48; 357/88; 357/90
[58] Field of Search .................. 357/30 D, 30 F, 30 G, 357/30 H, 30 P, 30 Q, 30 R, 30 L, 32, 25, 45, 48, 88, 90

[56] References Cited

U.S. PATENT DOCUMENTS

| 4,704,024 | 11/1987 | Tsunekawa | 357/30 |
| 4,746,804 | 5/1988 | Kitamura et al. | 357/30 |
| 4,831,430 | 5/1989 | Umeji | 357/30 |

FOREIGN PATENT DOCUMENTS 0296371 12/1988 European Pat. Off. .
54-115286 9/1979 Japan .

OTHER PUBLICATIONS

N. Kako et al., Sensors and Actuators, 4 (1983), pp. 655–660, "Combustion Detection With a Semiconductor Color Sensor".

Primary Examiner—Andrew J. James
Assistant Examiner—Ngan Van Ngo
Attorney, Agent, or Firm—Marmorek, Guttman & Rubenstein

[57] ABSTRACT

An ultraviolet-light sensitive photodiode device comprises a first semiconductor photodiode for producing a first current when illuminated by light and a second semiconductor photodiode for producing a second current when illuminated by light. The first and second photodiodes are electrically connected to produce a signal proportional to the difference between the first and second currents. The first and second photodiodes are substantially equal in sensitivity to visible and infrared light, while the first photodiode is more sensitive to ultraviolet light than the second photodiode. Thus, the photosensitive device resulting from connecting the two photodiodes has a spectrally narrow sensitivity to ultraviolet light.

17 Claims, 3 Drawing Sheets

ULTRAVIOLET-LIGHT PHOTODIODE

FIELD OF THE INVENTION

The present invention relates to a photodiode which is sensitive to ultraviolet light.

BACKGROUND OF THE INVENTION

Photodiodes sensitive to ultraviolet light are known from EP 0 296 371 A1 The known photodiodes sensitive to ultraviolet light are as a rule broadband devices and have relatively poor spectral selectivity.

Color sensors comprising a combination of two photodiodes with different spectral sensitivities are known for flame monitoring from the publication, "Combustion Detection With A Semiconductor Color Sensor," N. Kako et al, SENSORS AND ACTUATORS, 4 (1983), pages 655 to 660.

It is an object of the present invention to realize photodiodes sensitive to ultraviolet light with a spectral selectivity that is at least one order of magnitude better than that of the known photodiodes which are sensitive to ultraviolet light.

SUMMARY OF THE INVENTION

In accordance with an illustrative embodiment of the invention, an ultraviolet-light sensitive photodiode comprises two photodiodes which are electrically connected to each other in such a manner that when the two photodiodes are illuminated, a signal is produced which is proportional to the difference between the two diode currents.

The spectral sensitivity curves of the two photodiodes are nearly identical in the visible and infrared wavelength ranges, so that the diode current components resulting from illumination in these wavelength ranges nearly cancel each other out. A first one of the two photodiodes is more sensitive than the second photodiode in the ultraviolet wavelength range. This causes the spectral sensitivity curve formed by taking the difference of the individual spectral sensitivity curves of the two photodiodes to have a narrow maximum in the ultraviolet range, thereby producing a combined structure which is highly sensitive to ultraviolet light.

In one embodiment, the inventive ultraviolet-light sensitive photodiode is independent of temperature variations and fabrication processing variations. Such ultraviolet-light photodiodes are advantageously used for flame supervision in control equipment of combustion installations, e.g. in flame monitors of heating plants, as well as in ultraviolet-light measuring instruments or ultraviolet-light dosage meters for industrial and medical applications.

BRIEF DESCRIPTION OF THE DRAWINGS

Identical reference numbers designate the same parts in all the figures of the drawing.

DETAILED DESCRIPTION OF THE INVENTION

Figure 1:
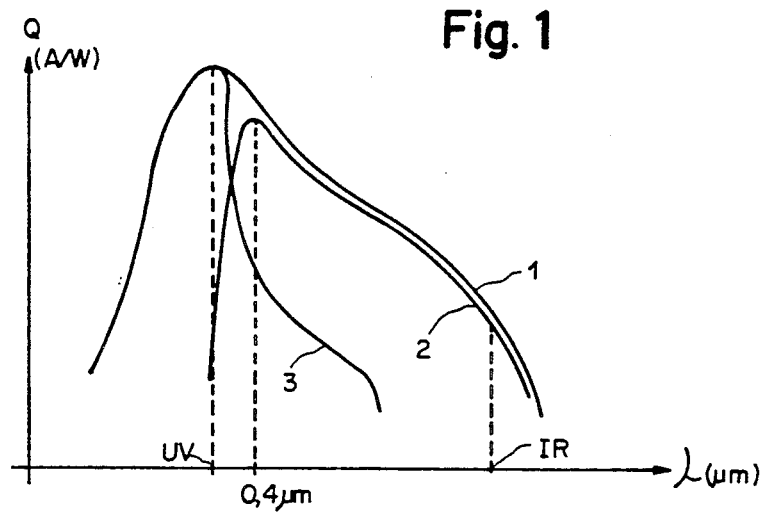
FIG. 1 shows spectral sensitivity curves of three different types of photodiodes.
Figure 2:
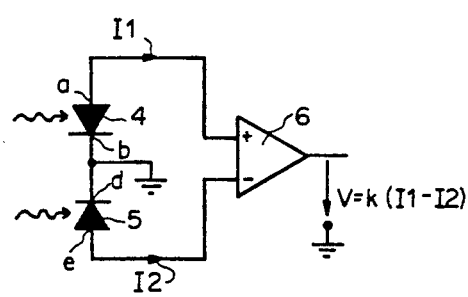
FIG. 2 shows a first embodiment of the circuitry of a compensated ultraviolet-light sensitive photodiode.
Figure 3:
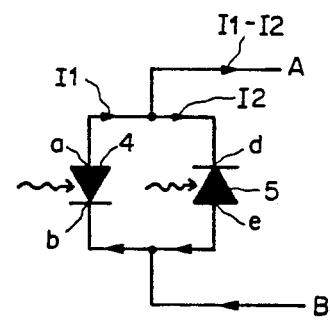
FIG. 3 shows a second embodiment of the circuitry of a compensated ultraviolet-light sensitive photodiode.

FIG. 1 shows spectral sensitivity curves 1 and 2 for the photodiodes 4 and 5 of FIGS. 2 and 3. The wavelength lambda of visible and invisible light is plotted along the abscissa and the spectral sensitivity Q is plotted along the ordinate. The spectral sensitivity Q is measured in amperes/watt for example, and the wavelength lambda is measured in $\mu m$.

The spectral sensitivity curve 1 for the first photodiode 4 has a maximum within the ultraviolet wavelength range UV, while the spectral sensitivity curve 2 for the second photodiode 5 has a maximum which is at a wavelength on the order of $0.4\mu$. The maxima of the spectral sensitivity curve 1 and 2 of the two photodiodes 4 and 5 thus have different wavelengths.

The spectral sensitivity curves 1 and 2 furthermore are nearly identical within the visible and infrared wavelength ranges so that the diode currents of the two photodiodes 4 and 5 resulting from illumination in these wavelength ranges nearly compensate each other when the difference between the two photodiode currents is obtained. The first photodiode 4 is much more sensitive than the second photodiode 5 within the ultraviolet wavelength range. Thus, the spectral sensitivity curve 3 formed by taking the difference between the two spectral sensitivity curves 1 and 2 has a narrowband within the ultraviolet wavelength range UV. The spectral sensitivity curve 3 is that of an ultraviolet-light sensitive photodiode 4;5 which is compensated according to the invention and is formed by a combination of the two photodiodes 4 and 5. The photodiodes 4 and 5 are electrically connected to each other in such manner that a signal occurs when the two photodiodes 4 and 5 are illuminated, the signal being proportional to the difference of the diode currents of the two photodiodes 4 and 5.

In FIGS. 2 to 5 the anode terminal is designated by a and the cathode terminal is designated by b in the first photodiode 4, while in the second photodiode 5 the cathode terminal is designated by d and the anode terminal is designated by e.

FIG. 2 shows a first embodiment of the compensated ultraviolet-light sensitive photodiode in which the two photodiodes 4 and 5 are electrically connected in series in opposite directions, whereby their common pole, e.g. formed by the cathode terminals b and d, is preferably grounded. The anode terminals a and e of the two photodiodes 4 and 5 thus constitute the terminals of a series connection and are each connected to one of two inputs of a differential amplifier 6 with a relatively low-ohm differential input resistance. The two photodiodes 4 and 5 function under the influence of visible and invisible light a sources of current and each supplies a diode current I1 or I2. The output voltage V of the differential amplifier 6 is then equal to k.[I1-I2], where k represents a proportionality constant.

FIG. 3 shows a second embodiment of the compensated ultraviolet light sensitive photodiode in which the two photodiodes 4 and 5 are electrically connected in parallel in opposite directions, so that the cathode terminal b, d of one photodiode 4, 5 is connected to the anode terminal e, a of the other photodiode 5, 4. Here too, the two photodiodes 4 and 5 each produce a diode current I1 or I2, with the parallel connection of the two photodiodes 4 and 5 forming a source of current under illumination which produces a differential current I1-I2 appearing at the terminals A and B of the parallel connection of the photodiodes 4 and 5.

In the two circuits shown in FIGS. 2 or 3, the two photodiodes 4 and 5 are thus electrically connected to each other so that when said two photodiodes 4 and 5 are illuminated, an output signal is produced that is proportional to the difference I1-I2 between the two diode currents I1, I2. Since the two diode currents I1 and I2 are nearly of the same magnitude within the visible and infrared wavelength ranges, current components resulting from these portions of the spectrum compensate each other. Substantially only the current components resulting from illumination of the photodiode 4 with the ultraviolet light UV remains, since the sensitivity of the photodiode 5 is substantially negligibly small compared to that of the photodiode 4 for the ultraviolet light UV. The combination of the two photodiodes 4 and 5 has then the spectral sensitivity curve 3 which has a much narrower sensitivity band than the characteristic curve 1 of the non-compensated photodiode 4.

The two photodiodes 4 and 5 ar made of semiconductor material and can be integrated in one and the same substrate 7 or can be assembled discretely with separate substrates. In the latter case they are electrically connected to each other outside their respective semiconductor materials. The semiconductor material can be silicon or GaAs in all instances. The layers 8 to 12, inclusive of 11a and 11b mentioned below each comprise semiconductor material and are trough-shaped as a rule. The semiconductor material is either of conductivity type N and is then designated by N, N1, N1R or N2, or of the opposite conductivity type P, and is in that case designated by P1, P1R or P2.

Figure 4:
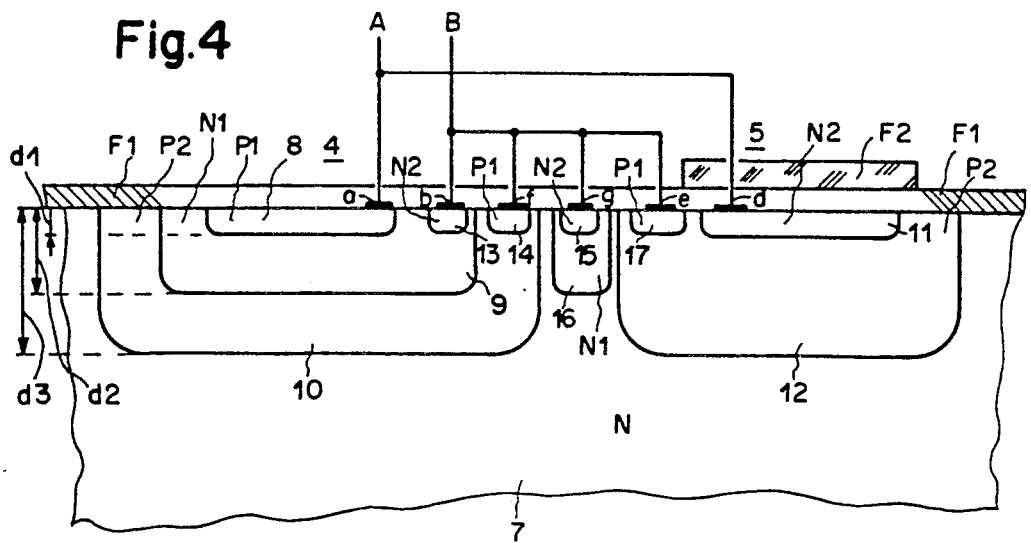
FIG. 4 shows a cross-section of a first embodiment of an integrated semiconductor structure corresponding to the compensated ultraviolet-light sensitive photodiode shown in FIG. 3.
Figure 5:
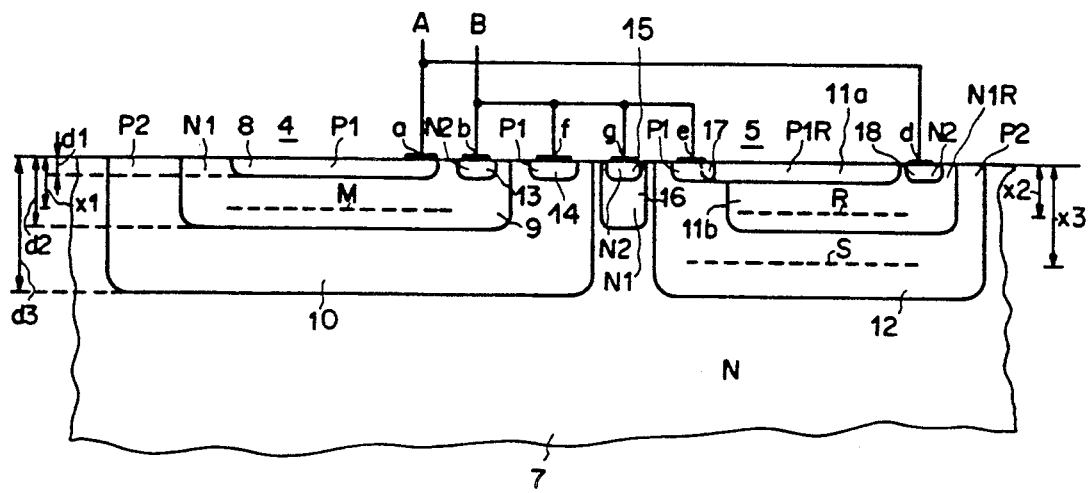
FIG. 5 shows a cross-section of a second embodiment of the integrated semiconductor structure corresponding to the compensated ultraviolet-light sensitive photodiode shown in FIG. 3.

It is assumed hereinafter that the combination of the two photodiodes 4 and 5 is made in the form of an integrated circuit and that the two photodiodes 4 and 5 are integrated within the same substrate 7. In FIG. 4 and FIG. 5 the first photodiode 4 is shown on the left side, and the second photodiode 5 on the right side of each drawing, with the two photodiodes 4 and 5 being electrically connected to each other as shown in FIG. 3.

The compensated ultraviolet-light sensitive photodiode 4;5 in the two embodiments shown in the FIGS. 4 and 5 comprises the substrate 7, of five layers 8 to 12 or six layers 8, 9, 10, 11a, 11b and 12, as well as of five or six contact diffusions 13 to 17 or 13 to 18.

The assembly of the first photodiode 4 is the same in both embodiments. In either case the photodiode 4 comprises the first layer 8 which is located at the surface within the second layer 9, which is in turn located at the surface in the third layer 10, which is in turn located at the surface in substrate 7. The layers 8 and 10 are made of semiconductor material of same conductivity type P1 and P2, respectively, and the layer 9 as well as substrate 7 are made of a semiconductor material of opposite conductivity type N1 and N, respectively. Each of the three layers 8, 9, and 10 is provided with a metal contact a, b, and f, respectively, at its surface. The contacts designated with b and f of the two layers 9 and 10 are electrically connected to each other outside the semiconductor material and are each provided with a contact diffusion 13 or 14 diffused at the surface into the corresponding layer 9 or 10.

In the first embodiment shown in FIG. 4, the photodiode 5 comprises the layer 11 which is located at the surface in the layer 12 which is in turn located at the surface in substrate 7. The substrate 7 and layer 11 are made of semiconductor material of the same conductivity type N and N2, respectively, while the layer 12 is made of a semiconductor material of opposite conductivity type P2. The layers 11 and 12 are each provided with a metallic contact d and e, respectively, at their surface, whereby the contact designated e of the layer 12 is provided with a contact diffusion 17 that is located at the surface in layer 12. The surfaces of at least the two photodiodes 4 and 5 are covered with a first filter layer F1 permeable to ultraviolet light which is able at the same time to perform the function of a passivation layer, so that no separate passivation layer is required. The photodiode 5 is also covered with a second filter layer F2 above the first filter layer F1. The second filter layer F2 does not transmit ultraviolet light. The second filter layer F2 covers only the photodiode 5. The two filter layers F1 and F2 can be equipped with openings for the connection of the metal connections to the corresponding metallic contacts a, b, d, f and g if necessary. The filter F1 is illustratively formed from $SiO_2$ and the filter F2 is illustratively formed from ZnS.

In the second embodiment shown in FIG. 5, the photodiode 5 comprises a double layer 11a, 11b which is located at the surface in layer 12 which is in turn located at the surface in substrate 7. The double layer 11a, 11b contains the layer 11a which is located at least in part at the surface in the layer 11b. The substrate 7 and the layer 11b comprise semiconductor material of the same conductivity type N and N1R, respectively, and the layers 11a and 12 comprise semiconductor material of opposite conductivity type P1R and P2, respectively. The layer 11a and/or the layer 12 are provided at their surface with a common metallic contact e and the layer 11b has a metallic contact d at its surface. The two contacts e and d are provided with the contact diffusions 17 and 18, respectively, located at the surface in the layers 11a and 11b, respectively. The layer 11a can be at the surface and entirely within the layer 11b. In that case the two layers 11a and 12 must be connected to each other outside the semiconductor material by means of electric short-circuit connections. Another possibility, as shown in FIG. 5, is to install layer 11a at the surface within layer 11b as well as within layer 12. In that case the two layers 11a and 12 are automatically electrically connected to each other. Since the two layers 11a and 12 are in both cases electrically connected to each other, the contact e with its contact diffusion 17 can be located at the surface of layer 11a as well as of layer 12. The second embodiment of the integrated assembly of the compensated ultraviolet-light sensitive photodiode of FIG. 3, as shown in FIG. 5, is thus similar to the first embodiment as shown in FIG. 4, with the main difference that the layer 11 is replaced by the combination of the two layers 11a and 11b.

In both embodiments, the substrate 7 is provided with a metallic contact g at the surface. The contact g is formed on a contact diffusion 15 which is located at the surface either directly in substrate 7 or, as shown in FIG. 4 and FIG. 5, in an additional contact diffusion 16. Both contact diffusions 15 and 16 are made of semiconductor material of the same conductivity type N2 and N1, respectively. The additional contact diffusion 16 is located at the surface in substrate 7.

The metal contacts a, b, d, e, f and g, including in some cases a corresponding contact diffusion, each represent an ohmic connection contact. In FIGS. 4 and 5 the connection contacts a and d on the one hand as well as b, f, g and e on the other hand are electrically connected to each other by means of a metallization (not shown) or, as shown in FIGS. 4 and 5, by means of connections located outside the semiconductor material in order to achieve the electric circuit shown in FIG. 3.

It was assumed in FIGS. 4 and 5 that, insofar as they are present, the layers 8, 11 and 11a as well as the contact diffusions 13 to 15 and 17 to 18 have the same diffusion depth d1, that the layers 9 and 11b as well as the contact diffusion 16 have the same diffusion depth d2 and that the layers 10 and 12 have the same diffusion depth d3.

The layer 9 and the contact diffusion 16 have nearly identical doping, and this is indicated by the designation N1. The contact diffusions 13, 15 and, insofar as it is present 18, also have identical doping, although of a different amount, and this is indicated by the designation N2. The layer 11b, if present, has in turn yet another amount of doping, and this is indicated by the designation N1R. The layer 8 as well as the contact diffusions 14 and 17 also have the same doping, this being indicated by the designation P1, while the layers 10 and 12 have identical doping but of a different amount, this being indicated by the designation P2. The layer 11a, if present, is provided with yet another value of the doping, this being indicated by the designation P1R. The substrate 7 has its own value of doping, this being indicated by the designation N.

The layers 8, 9 and 10 made of P1, N1 and P2 material make up the photodiode 4. The layers 11a, 11b and 12 made of P1R, N1R and P2 material or the layers 11 and 12 made of N2 and P2 material make up photodiode 5 in the drawing of FIGS. 5 or 4. These layers respectively determine the basic optical and electrical properties of the photodiodes 4 and 5.

A metallization layer and a passivation layer which as a rule are located on the surface of the semiconductor material have not been shown in FIGS. 4 and 5 for the sake of simplification, unless the passivation layer is identical with the first filter layer F1.

Figure 6:
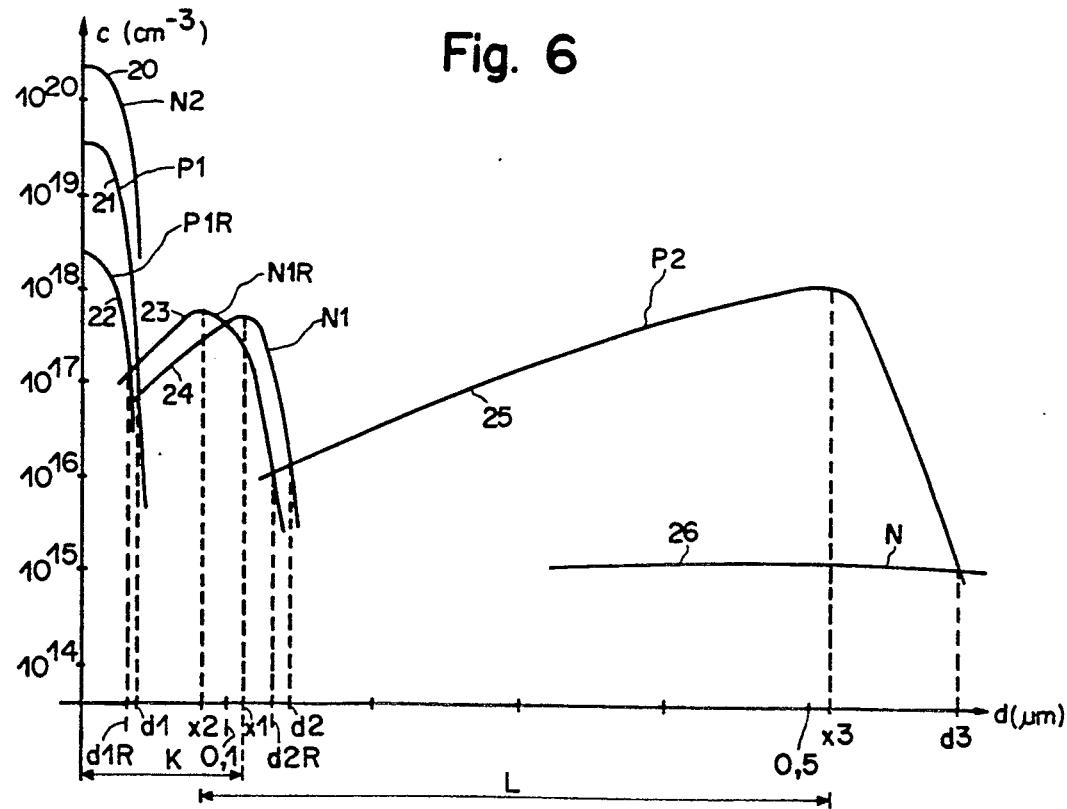
FIG. 6 shows doping profiles of different semiconductor layers of the compensated ultraviolet-light sensitive photodiode shown in FIG. 5.

The distribution of impurity atoms in the semiconductor material is shown in form of seven doping profile curves 20 to 26 in FIG. 6. These curves plot carrier concentrations c as a function of the diffusion depths d. The carrier concentrations c
are measured in $cm^{-3}$ for example, and the diffusion depths in $\mu m$. These doping profiles are achieved by means of ion implantations and have nearly the configuration of characteristic Gaussian curves. In this case, the curve 20 corresponds to the doping N2, the curve 21 to the doping P1, the curve 22 to the doping P1R, the curve 23 to the doping N1R, the curve 24 to the doping N1, the curve 25 to the doping P2 and the curve 26 to the doping N. The curves 20 to 22 each show a maximum at the surface of the semiconductor material, i.e. at a value $d=0$. The maxima of the curves 23 to 25 respectively have the values of d equal to x2, x1 and x3, while the curve 26 does not have a distinct maximum. The curve 25 crosses the curve 26 at a value $d=d3$ and crosses the curves 23 and 24 at a value $d=d2R$ and $d=d2$. The curve 22 crosses the curve 23 at a value $d=d1R$ and the curve 21 crosses the curve 24 at a value $d=d1$.

Typical doping is as follows:

P1 material: Boron, $E=10$ keV and $Q=6 \times 10^{13} cm^{-2}$,

P1R material: Boron, $E=10$ keV and $Q=1 \times 10^{13} cm^{-2}$,

P2 material: Boron, $E=200$ keV and $Q=3 \times 10^{13} cm^{-2}$,

N1 material: Phosphorus, $E=100$ keV and $Q=3 \times 10^{13} cm^{-2}$,

N1R material: Phosphorus, $E=80$ keV and $Q=3 \times 10^{13} cm^{-2}$ and

N1 material: Phosphorus, $E=32$ keV and $Q=1 \times 10^{15} cm^{-2}$.

The letter E designates the ion energy here, and Q the ion dose. The ion implantations are made through a layer $SiO_2$ which has a thickness of nearly 30 nm and is not shown in the drawing. Following the ion implantations a rapid thermal annealing step follows in order to activate the impurity atoms. This annealing step must occur very rapidly so that no distribution of impurity atoms may take place.

The layer 9 of the photodiode 4 has a photo-sensitive region K immediately below the surface of the semiconductor material (see FIG. 6) extending from said surface to a potential barrier M (see FIG. 5) located at a depth $d=x1$ of approximately 0.1 $\mu m$ in the semiconductor material of layer 9. This first potential barrier M is represented in FIG. 5 by a broken line within the semiconductor material of layer 9. The depth of this photo-sensitive area of the photodiode 4 is approximately equal to the penetration depth of the ultraviolet light into the semiconductor material. Since the penetration depth of visible light and of infrared light into this semiconductor material is considerably greater than the depth of the photo-sensitive area of the photodiode 4, only a minuscule portion of the non-ultraviolet light is absorbed in this area so that the photodiode 4 is much more sensitive to ultraviolet light than to visible light and infrared light.

The photodiode 5 also has a photo-sensitive region which is designated by the letter L (see FIG. 6) and which, in the embodiment shown in FIG. 5, is located between a second potential barrier R lying at a depth $d=x2$ in the semiconductor material N1R of the layer 11b, and a third potential barrier S which lies at a depth $d=x3$ in the semiconductor material P2 of layer 12 (see FIG. 5). However the second potential barrier R can also be located at the surface of the semiconductor material as shown in the embodiment of FIG. 4. Thus the photodiode 5 is provided always with at least the potential barrier S within its corresponding part of the semiconductor material. The potential barrier S is always placed at a greater depth in the semiconductor material than the potential barrier M of the photodiode 4.

In general the formula: $0 \leq x2 < x3$ applies.

In FIG. 5 the two potential barriers R and S are shown by broken lines in the semiconductor material N1R of the layer 11b and P2 of the layer 12, respectively.

When $x2 > 0$, the photo-sensitive region L of the photodiode 5 is buried in the semiconductor material and the ultraviolet light is almost completely absorbed in the area of the semiconductor material lying between the surface of the semiconductor material and the second potential barrier R, while the visible light and the infrared light is absorbed in the photo-sensitive area L of the photodiode 5. The photodiode 5 is thus more sensitive to visible light and infrared light than to ultraviolet light. The case $x2 > 0$ is represented in FIG. 5.

When $x2 = 0$, the photodiode 5 is also ultraviolet-sensitive. In this case this non-desired ultraviolet sensitivity of the photodiode 5 must be reduced by one of the following methods:

1. The active surface AR of the photodiode 5—i.e. the projection of the second potential barrier R on the surface of the photodiodes must be much smaller than the active surface $A_M$ of the photodiode 4—i.e. the projection of the first potential barrier M on the surface of the photodiode 4.
2. The surface of the photodiode 5 must be covered with an additional optical filter layer F2 which only allows light with long wavelengths to pass (see FIG. 4). Window glass of several millimeters thickness allowing light with wavelengths of over 0.35 μm to pass, or a thin layer of a semiconductor such as for example ZnO or ZnS allowing light with wavelengths of over 0.36 μm or 0.33 μm to pass can be used as filter material. The thickness of the thin layer is in that case around 1.0 μm.

The thickness x3-x2 of the photo-sensitive region L of the photodiode 5 is much smaller than both the penetration depth of the infrared light and the diffusion length of the charge carriers, i.e. x3-x2 should be less than 1 μm. In that case the dependence on temperature and the dependence on process variations of the infrared sensitivity of the two photodiodes and 5 are nearly equal. Even better adaptation of the respective infrared sensitivity of the two photodiodes 4 and 5 is achieved if the following equation is met:

$$T_4 \cdot A_M \cdot x1 = T_5 \cdot A_R \cdot (x3-x2) \qquad (I),$$

where $T_4$ and $T_5$ are the transmission coefficients for infrared light and for visible light in the layer which covers the surface of the photodiode 4 or 5. Since $T_4$ and $T_5$ are nearly equal, this means that the photo-sensitive regions of the two photodiodes 4 and 5 should have nearly the same volume.

The following typical values apply to the above-indicated ion energies:

$$x1 \neq x2 = 0.1 \ \mu m \text{ and}$$

$$x3 = 0.5 \ \mu m$$

With these values, the equation (I) results in: $A_m / A_4 \neq 4$, whereby $A_M = 0.8 \ mm^2$ and $A_R = 0.2 \ mm^2$ for example.

Since there is an advantage, in practice, to use as many layers as possible with the same diffusion depth, the curves 21 to 24 are selected as much as possible so that d1=d1R and d2=d2R approximately, as was assumed in the drawing of FIG. 5.

In the arrangement shown in FIG. 4 the semiconductor layer 11 made of N2 material assumes the role of the layer 11b made of N1R material of the arrangement shown in FIG. 5, while the semiconductor layer 11a made of P1R material is not present. This applies in the case x2=0.

Figure 7:
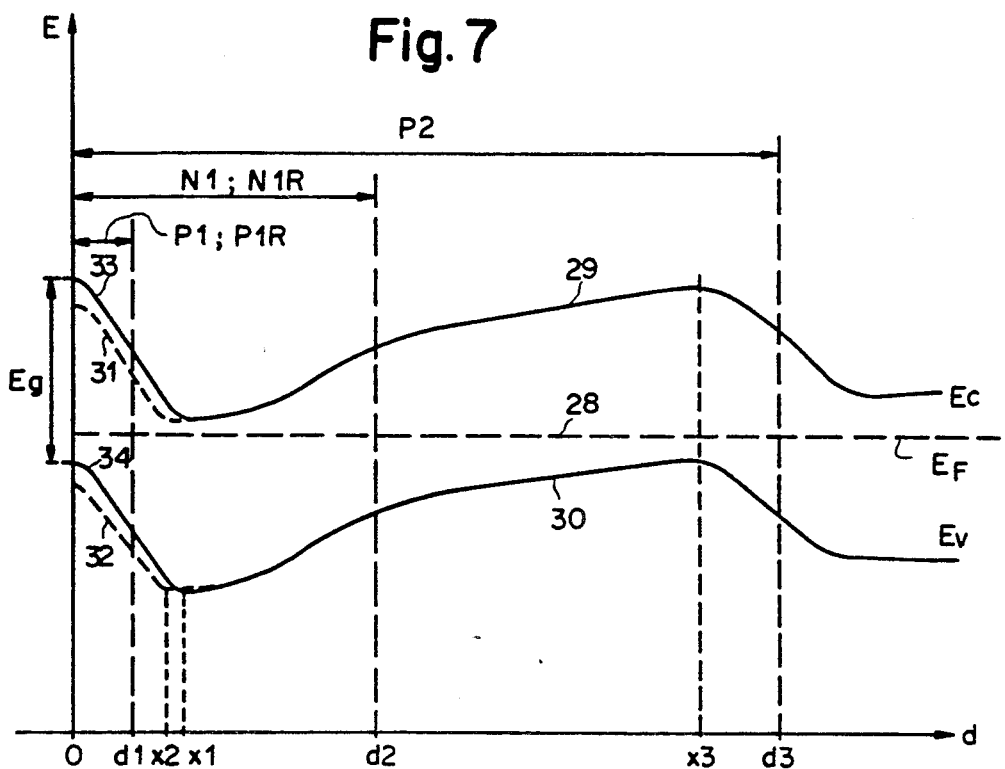
FIG. 7 shows the energy levels within the semiconductor layers of a compensated ultraviolet-light sensitive photodiode.

FIG. 7 shows the energy levels within the different semiconductor layers of the arrangement shown in FIG. 5 as a function of the diffusion depth d. FIG. 7 also shows the positions d1, d2 and d3 of the boundaries between two neighboring layers as well as the positions x1, x2 and x3 of the different doping maxima. A broken line 28 parallel to the abscissa represents the Fermi level $E_F$ while the curve 29 which is uppermost in the drawing represents the conduction band limit $E_C$ and the lower curve 30 represents the valence band limit $E_V$. The distance between the two curves 29 and 30, measured parallel to the ordinate, is the band gap energy $E_g$. The portions 31 and 32 of curves 29 and 30, shown on the left side in FIG. 7 correspond to the photodiode 5, while the curve portions 33 and 34 drawn in a solid line belong to the photodiode 4.

The potential minima at a depth $d=x1$ and $d=x2$ prevent the holes generated in the surface regions $0 > d > x1$ and $0 > d > x2$ from penetrating into the regions $d > x1$ and $d > x2$, respectively, of the photodiodes 4 and 5 and thus carry out the functions of the first and second potential barriers M and R. The potential maximum at $d=x3$ prevents the electrons generated in the substrate 7 from penetrating into the area $d < x3$ and thus carries out the function of the third potential barrier S.

Figure 8:
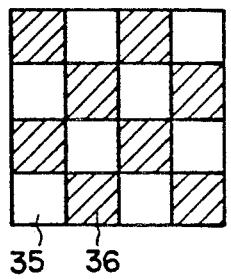
FIG. 8 shows a top view of a first embodiment of a compensated ultraviolet-light sensitive photodiode suitable for measuring non-uniform light.
Figure 9:
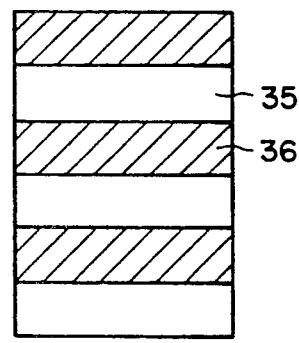
FIG. 9 shows a top view of a second embodiment of a compensated ultraviolet-light sensitive photodiode suitable for measuring non-uniform light.
Figure 10:
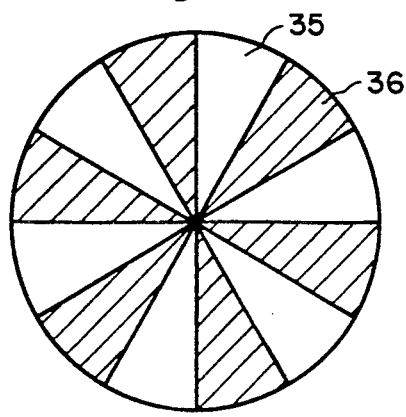
FIG. 10 shows a top view of a third embodiment of a compensated ultraviolet-light sensitive photodiode suitable for measuring non-uniform light.

In measuring non-uniform light, the photodiodes 4 and 5 preferably comprise a plurality of smaller photodiodes 35 or 36 which are connected in parallel, and which, as is shown in FIGS. 8 to 10, are arranged in a spatially alternating manner at the surface in the substrate 7. In FIG. 8 the horizontal surface projections of the smaller photodiodes 35 and 36 are arranged in squares. The smaller photodiodes 35 and 36 in horizontal surface projection alternate in a manner similar to the white and black squares of a chess board. In FIG. 9 the horizontal surface projections of the smaller photodiodes 35 and 36 are rectangular and the smaller photodiodes 35 and 36 are arranged in horizontal surface projection in the form of strips, alternately one above the other or next to each other (not shown). In FIG. 10 the compensated ultraviolet-light sensitive photodiode 4; 5 has a circular horizontal surface projection. In this case the horizontal surface projection of the smaller photodiodes 35 and 36 are preferably in form of sectors of a circle and the smaller photodiodes 35 and 36 in horizontal surface projection are arranged alternately around a circle, next to each other.

The two photodiodes 4 and 5 can also be realized in discrete or hybrid variants. In this case they are formed in two separate semiconductor chips and these are in turn mounted either in two separate housings or on one common ceramic substrate. Each of the two photodiodes 4 and 5 is here covered by means of separate filters F1 and F2 or by means of separate lenses, the lenses assuming the role of the filters F1 and/or F2. The photodiode 4 can be covered by a lens or filter allowing ultraviolet light to pass, for instance, while the photodiode 5 is covered with a lens or filter which does not allow ultraviolet light to pass. The compensated ultraviolet-light sensitive photodiode can be produced by using known process steps normally used in integrated semiconductor technology such as for example lithography, ion implantation, deposition of thin layers, etc.

Finally, the above-described embodiments of the invention are intended to be illustrative only. Numerous alternative embodiments may be devised by those skilled in the art, without departing from the spirit and scope of the following claims.

We claim:

1. An ultraviolet-light sensitive photodiode device comprising
    first and second photodiodes electrically connected to each other so that when said first and second photodiodes are illuminated a signal is produced proportional to the difference between first and second diode currents produced by said first and second photodiodes,
    said first photodiodes having a first spectral sensitivity curve having a first maximum in the ultraviolet wavelength range,
    said second photodiode having a second spectral sensitivity curve having a second maximum at a wavelength different from said first wavelength,
    said first and second spectral sensitivity curves having nearly identical values in the visible and infrared wavelength ranges, so that components of said first and second diode currents produced from wavelengths of light in the visible and infrared wavelength ranges nearly cancel each other, and
    said first photodiode being more sensitive to ultraviolet light than said second photodiode, so that the combined spectral sensitivity curve of said first and second diodes formed by taking the difference of said first and second spectral sensitivity curves has a narrowband of sensitivity including a maxima in the ultraviolet wavelength range.

2. The ultraviolet-light sensitive photodiode device of claim 1 wherein said first and second photodiodes are formed in first and second portions of a semiconductor material.

3. The device of claim 2 wherein the first photodiode is provided with a first potential barrier within said first portion of semiconductor material, and wherein said second photodiode is provided with an additional potential barrier within the second portion of semiconductor material, said additional potential barrier being located at a greater depth in said semiconductor material than said first potential barrier.

4. The ultraviolet-light sensitive photodiode device of claim 2 wherein the two photodiodes are formed in a common semiconductor substrate, said substrate being provided with a contact at its surface, said contact being formed on a contact diffusion which is located at the surface of the substrate, whereby the contact diffusion is made of semiconductor material of the same conductivity type as the substrate.

5. The ultraviolet-light sensitive photodiode device of claim 4 wherein said contact diffusion is formed in an additional contact diffusion located in the surface of said substrate and having the same conductivity type as said substrate.

6. The ultraviolet-light sensitive photodiode device of claims 1, 2, 3, 4, 5, or 6 wherein the first photodiode comprises a first semiconductor layer which is located at the surface in a second semiconductor layer which is in turn located at the surface of a third semiconductor layer which is in turn located at the surface in a semiconductor substrate, said first and third layers being made of semiconductor material of the same conductivity type and said second layer being made of semiconductor material of opposite conductivity type, each of said first, second, and third layers being provided with a contact, the contacts of the second and third layers being electrically connected to each other and are each provided with a contact diffusion which is diffused at the surface into the corresponding layer.

7. The ultraviolet-light sensitive photodiode device as in one of the claims 1, 2, 3, 4, 5 and 6, wherein the second photodiode comprises a first semiconductor layer which is located at the surface in a second semiconductor layer which is in turn located at the surface in a semiconductor substrate, the substrate and the first layer of said second photodiode being made of semiconductor material of the same conductivity type and the second layer of said second photodiode being made of semiconductor material of opposite conductivity type, each of the first and second layers of the second photodiode being provided with a contact at its surface, whereby the contact of the second layer of the second photodiode is provided with a contact diffusion located at the surface in the second layer of the second photodiode, and wherein the surface of the first and second photodiodes is covered with a first filter layer which transmits ultraviolet light and in that the second photodiode is covered above the first filter layer with a second filter layer which does not transmit ultraviolet light.

8. The ultraviolet-light sensitive photodiode device as in one of the claims 1, 2, 3, 4, or 5, wherein the second photodiode comprises of a double semiconductor layer which is located at the surface in a second semiconductor layer which is in turn located at the surface in a semiconductor substrate, whereby the double layer contains a first layer which is located at least in part at the surface in an additional layer, the substrate and the additional layer being made of semiconductor material of the same conductivity type and the first and second layers of the second photodiode being made of semiconductor material of the opposite conductivity type, and wherein the first layer and the second layer have a common first contact at their surface while the additional layer is provided with a second contact, whereby the first and second contacts are each provided with a contact diffusion which is located at the surface in the corresponding layer.

9. The ultraviolet-light sensitive photodiode device of claims 1, 2, 3, 4, or 5, wherein each of the first and second photodiodes comprises a plurality of smaller photodiodes connected in parallel and which alternate spatially at the surface in the substrate.

10. The ultraviolet-light sensitive photodiode device as in claim 9, wherein the surface projections of the smaller photodiodes are square.

11. The ultraviolet-light sensitive photodiode device as in claim 9, wherein the surface projections of the smaller photodiodes are rectangular and in that the smaller photodiodes in surface projection are arranged in the form of alternating strips.

12. The ultraviolet-light sensitive photodiode as in claim 9, wherein the surface projections of the smaller photodiodes are in the shape of sections of a circle and in that the smaller photodiodes in surface projection are arranged alternately around a circle, next to each other.

13. The ultraviolet-light sensitive photodiode device of claim 1, wherein the first and second photodiodes are connected electrically in series in opposite directions, and wherein one terminal of each of said photodiodes is connected to an input of a differential amplifier.

14. The ultraviolet-light sensitive photodiode device of claim 1, wherein the two photodiodes are electrically connected in parallel in opposite directions and produce a differential current under illumination.

15. An ultraviolet-light sensitive photodiode device comprising a first semiconductor photodiode for producing a first current when illuminated by light, a second semiconductor photodiode for producing a second current when illuminated by light, said first and second photodiodes being electrically connected to produce a signal proportional to the difference between said first and second currents, said first and second photodiodes being substantially equal in sensitivity to visible and infrared light and said first diode being more sensitive to ultraviolet light than said second diode, so that the photosensitive device resulting from electrically connecting said first and second diodes has a spectrally narrow sensitivity to ultraviolet light.

16. The device of claim 15 wherein said first and second diodes are formed in an integrated semiconductor structure.

17. The device of claim 16 wherein said first and second photodiodes each comprise a plurality of semiconductor layers for providing each of said first and second photodiodes with a potential barrier, the potential barrier of said second photodiode being deeper in said semiconductor structure than said potential barrier of said first photodiode so that said first photodiode is more sensitive to ultraviolet light.

* * * * *